United States Patent [19]

Kennedy et al.

[11] Patent Number: 5,515,515

[45] Date of Patent: May 7, 1996

[54] LIVE DATA STORAGE ARRAY SYSTEM HAVING INDIVIDUALLY REMOVABLE, AND SELF-CONFIGURING DATA STORAGE UNITS

[75] Inventors: Barry Kennedy, Santa Ana; Randall S. Welch, Lake Forest, both of Calif.

[73] Assignee: AST Research, Inc., Irvine, Calif.

[21] Appl. No.: 19,014

[22] Filed: Feb. 18, 1993

[51] Int. Cl.$^6$ .......................... G06F 13/00; H05K 7/00; H01R 13/642; H01R 9/09

[52] U.S. Cl. .................. 395/283; 364/929.4; 364/952.1; 364/940.2; 364/DIG. 2

[58] Field of Search .................................... 395/325, 283; 361/685, 686, 727; 360/97.01, 97.03; 369/75.1; 439/64, 377; 364/708.1

[56] References Cited

U.S. PATENT DOCUMENTS

| | | | |
|---|---|---|---|
| 4,941,841 | 7/1990 | Darden et al. | 361/685 |
| 5,157,771 | 10/1992 | Losi et al. | 395/283 |
| 5,195,022 | 3/1993 | Hoppal et al. | 361/391 |
| 5,233,594 | 8/1993 | Wilhelm | 369/75.1 |
| 5,243,495 | 9/1993 | Read et al. | 361/685 |
| 5,253,133 | 10/1993 | Guo | 360/97.01 |
| 5,272,584 | 12/1993 | Austeruy | 361/58 |
| 5,299,944 | 4/1994 | Larabell et al. | 439/157 |
| 5,319,519 | 6/1994 | Sheppard | 361/685 |
| 5,325,263 | 6/1994 | Singer et al. | 361/683 |
| 5,333,097 | 7/1994 | Christensen | 361/685 |
| 5,340,340 | 8/1994 | Hastings | 439/64 |
| 5,349,483 | 9/1994 | Tsai | 360/97.01 |
| 5,379,184 | 1/1995 | Barraza et al. | 361/685 |
| 5,412,534 | 5/1995 | Cutts et al. | 361/695 |
| 5,432,916 | 7/1995 | Hahn et al. | 395/283 |
| 5,454,080 | 9/1995 | Fasiq et al. | 395/283 |

OTHER PUBLICATIONS

Gauvin, Jeffrey J., "Choose the Best SCSI Adapter Architecture", *Electronic Design*, pp. 59–64, Mar. 8, 1990.

Costlow, Terry, "'Terminator' Stalks SCSI Designers", *Electronic Engineering Times*, pp. 75–76, 104, Dec. 9, 1991.

Schulze, Martin E., "Considerations in the Design of a RAID Prototype".

Report No. UCB/CSD 88/448, pp. 1–35, Aug. 25, 1988.

Anderson, David B. et al., "Disk Array Considerations", pp. 41–50.

Patterson, David A. et al., "A Case for Redundant Arrays of Inexpensive Disks (RAID)", ACM SIGMOD Conference, pp. 109–116, Jun. 1–3, 1988.

Moren, Bill, "SCSI–2 and Parallel Disk Drive Arrays", *Technology Update*, Nov. 1988.

Legacy M.A.S.S. HFD Multi–Additional SCSI Subsystem "Hot Fix Device", 1991.

Intelligent Array Subsystem product information, Oct. 1991.

(List continued on next page.)

*Primary Examiner*—Gopal C. Ray
*Attorney, Agent, or Firm*—Knobbe, Martens, Olson & Bear

[57] ABSTRACT

A small computer system interface (SCSI) disk array subsystem has removable disk drive units that can be removed while the subsystem has power applied to it and is operational. In order to prevent malfunctions of other disks in the disk array, and in order to prevent rapid fluctuations in the current in the power circuits of the subsystem, the power and the data and control signals are applied to the inserted disk drive unit in a phased sequence. Initially, the ground of the disk drive unit is connected to the ground of the subsystem along with precharge power which connects the power buses of the disk drive unit to the power buses of the subsystem through resistors so that capacitances connected to the power buses of the disk drive unit are charged gradually through the resistors rather than abruptly. Thereafter, power is applied directly from the power buses of the subsystem to the power buses of the disk drive unit. Finally, the control and data signal connections are made between the subsystem and the disk drive unit. This phased sequence of connections between the subsystem and the disk drive unit is accomplished by providing sets of contacts having differing lengths in a connector on the disk drive unit so that some connections are made before other connections.

30 Claims, 12 Drawing Sheets

OTHER PUBLICATIONS

"The Dell Drive Array", pp. 1–12, Oct. 31, 1990.

Self–Healing Parallel Drive Array 1.2, 2.5, and 4 GB Capacities product information, Nov. 1990.

JMR Tower mechanical specification for Micro–Tower, Mini–Tower, Mid–Tower, Sky–Tower.

Pacstor Integra I Fault Tolerant Disk Array Subsystem product information, 1989.

Pacstor–Integra I features & benefits information, Nov. 1989.

Barnes, Brady, "Insert Boards Into A Live System without any Hitches", *Electronic Design*, pp. 75–80, May 11, 1989.

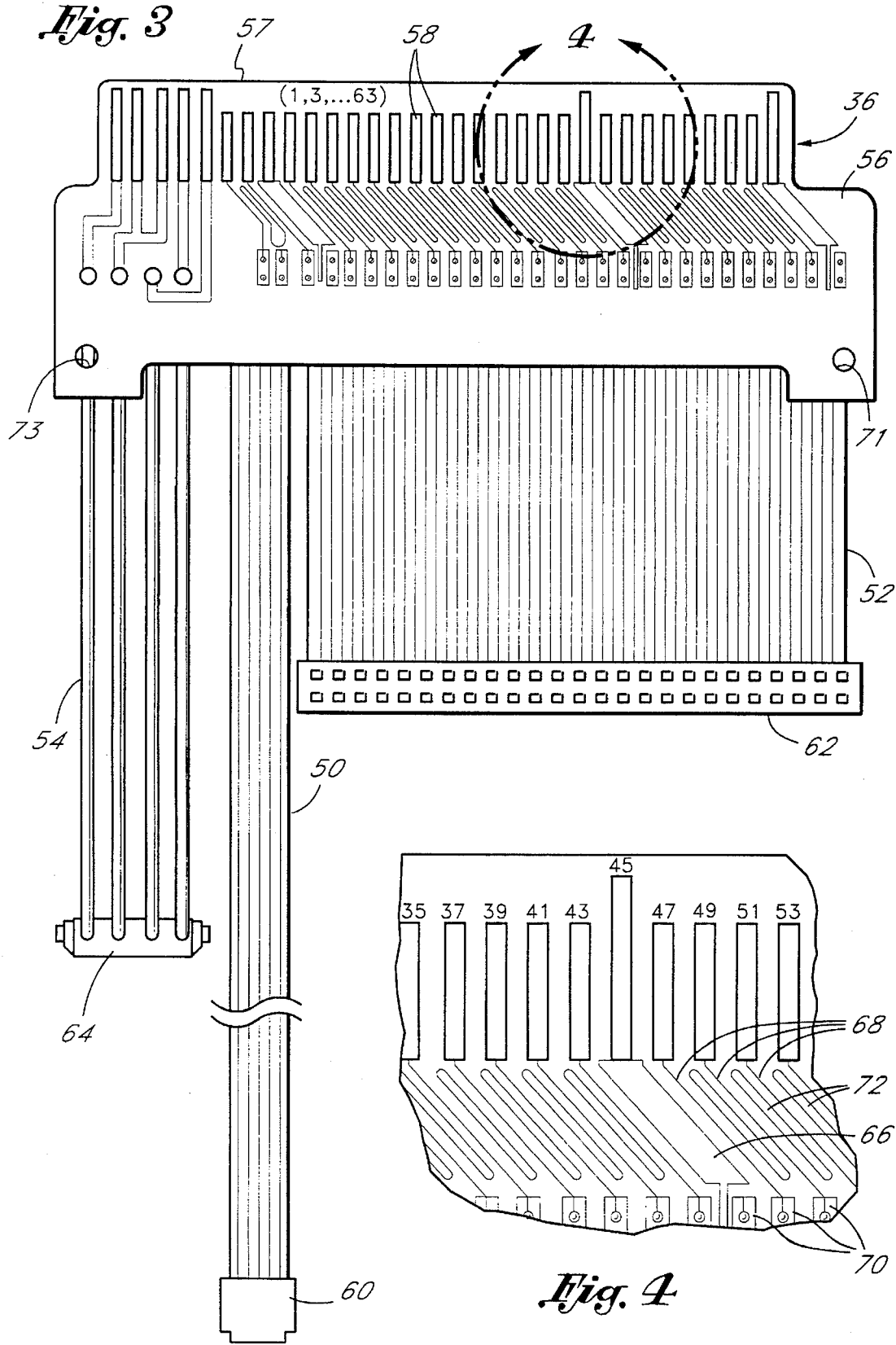
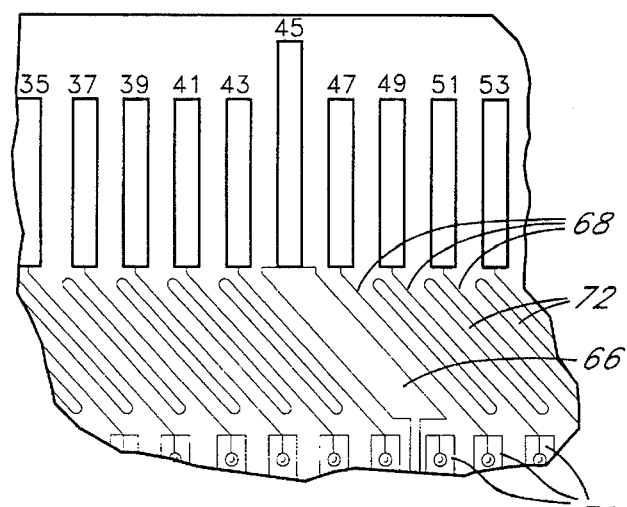

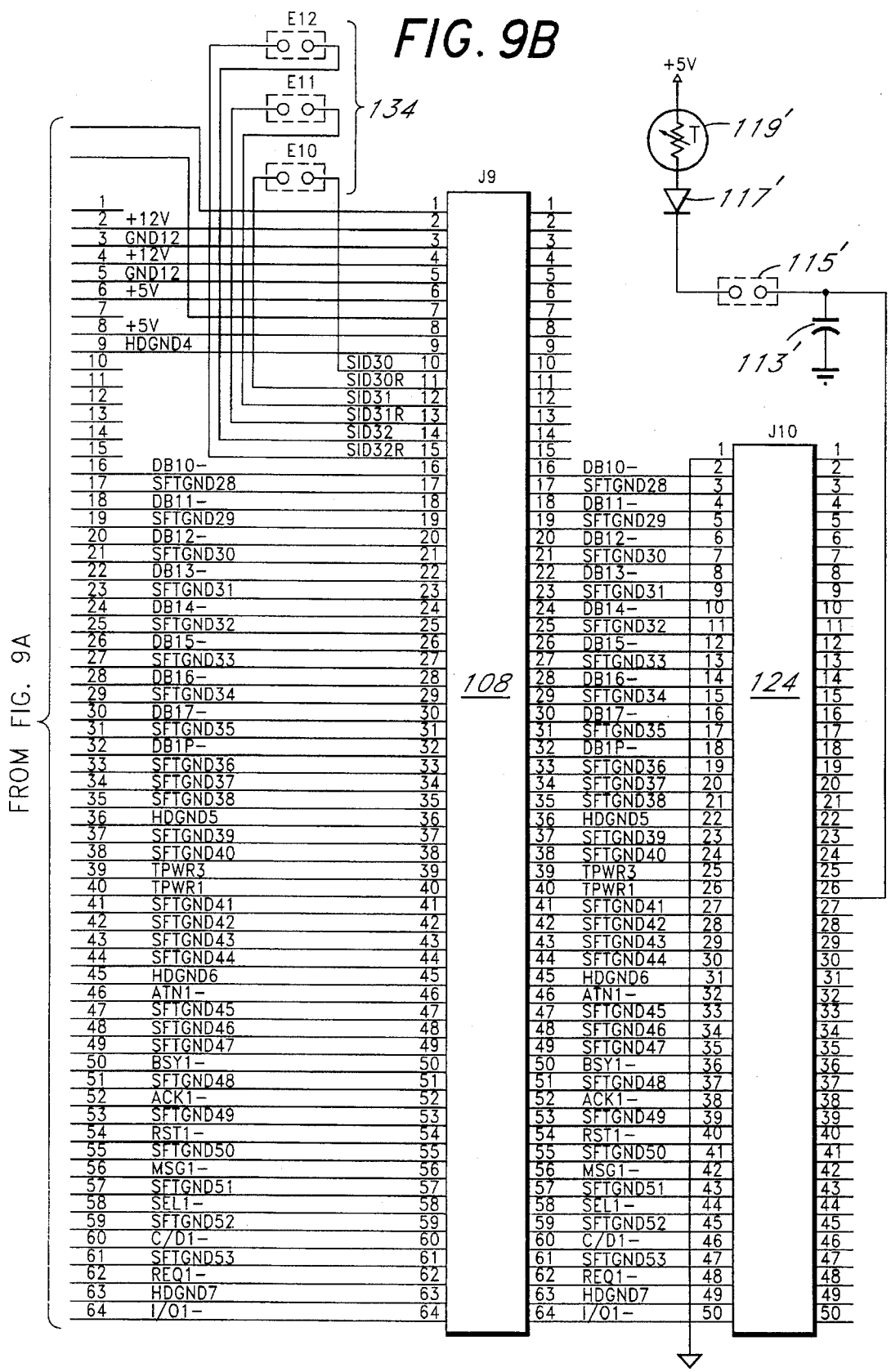

LIVE DATA STORAGE ARRAY SYSTEM HAVING INDIVIDUALLY REMOVABLE, AND SELF-CONFIGURING DATA STORAGE UNITS

BACKGROUND OF THE INVENTION

1. Field of the Invention

This invention relates generally to computer disk array subsystems used for storing data, and particularly to interfaces between a disk array subsystem and a small computer system. More specifically, this invention relates to an improved disk array subsystem that incorporates a disk drive interface allowing disk drives to be removed and inserted while the system is operating.

2. Description of the Related Art

Within the computer industry and more specifically within the computer data storage field, multiple data storage units are often coupled as an array to provide increased data storage capability. In addition to increasing the data storage size, these devices also increase the speed at which data can be stored and accessed by spreading a block of data among several storage units. For example, several disk drives within an array subsystem may be used to store a block of data, even though the block of data would fit within one disk drive. By storing the data on multiple disk drives, there is less time spent waiting for mechanical movement of read/write heads to a different disk track, or waiting for rotation of the storage media itself. Instead, data is read in a parallel fashion from multiple disks to allow faster data access. In this manner, data can be read faster, thus reducing or eliminating time spent in computer wait cycles.

The disk storage devices that use the industry standard small computer system interface (SCSI) are referred to as SCSI devices. Multiple disk storage devices are commonly referred to as a SCSI disk array.

During operation of a SCSI disk array subsystem, one of the disk drive units may occasionally need to be replaced. In order to replace a disk drive in a conventional disk array system, it is usually necessary to power down the entire system, remove the disk drive, insert a new one and again apply power to the system.

A SCSI disk drive uses what is commonly known as a 50-pin box header connector for interfacing SCSI signals between a disk drive and a computer controller. The box connector has two parallel rows of male pins of equal length that mate with a corresponding box connector with female pins. The power to the SCSI disk is applied via a separate 4-pin connector. Combining these two disk connectors into one connector with equal length pins would solve the quick connect/disconnect problem, but would still cause a system problem. Specifically, because the pins are of equal length, use of a one-piece connector mandates that power be shut down before insertion of the new disk drive unit. Otherwise, upon connection, power and data signals will be sent to the disk drive unit simultaneously which could create data loss or damage to the disk drive unit as a result of power surges or unwanted static discharge. Powering down the disk assembly for replacement of failed disk drive units reduces the amount of time the system is available to the user to perform useful work.

It is thus desired to have a disk array subsystem whereby upon failure of a disk drive unit, the failed unit may be removed and a new unit inserted without powering down the system. In this manner, the time to repair the system is minimized, increasing its availability of the user.

Typically, each disk drive unit within a disk array subsystem has an ID number which corresponds to a physical disk drive slot. The ID number is used for control purposes and to select the disk drive to be involved in the data transfer. When a disk drive fails, the new disk drive must be given the same ID number as the drive that it is replacing. This entails matching certain jumper block settings on a disk drive to an ID number for a particular disk drive slot. Previously, this has been done manually by the operator who is replacing the disk drive. The ID numbers for each disk drive slot of the improved assembly are preset on the backplane. Manually setting the ID number on the new disk drive would increase the amount of time the system was under repair and would also be prone to error which could cause permanent data corruption.

Accordingly, there exists a need for a disk drive subsystem whereby new disk drives can be quickly assigned a new ID number and inserted into the disk array subsystem without powering down the system.

SUMMARY OF THE INVENTION

The drawbacks and deficiencies that exist in the prior art as discussed above have been overcome by the present invention through the use of a disk drive mounting bracket and an adapter that allows for insertion of a disk drive unit while power is continually applied to a disk array subsystem.

In accordance with the present invention, a small computer system interface disk array subsystem is disclosed which contains an enclosure for accommodating one or more disk drives, a mounting bracket which is attached to each of the disk drives, a backplane attached to the enclosure for providing power and transferring signal data, and an adapter for electrically and mechanically connecting each disk drive unit to the backplane.

The adapter consists of a small printed circuit board assembly and is attached to the disk drive mounting bracket. The adapter has variable length metal contact strips, or fingers, that allow certain lines or signals to be received by and be electrically connected to the disk drive unit before others. In addition, the adapter has three cables for transference of power, ID signals and data signals to the disk drive. Specifically, a cable from the adapter is attached to the disk drive for transferring power while data signals are passed to the disk drive through a ribbon cable assembly.

When inserting a new disk drive unit, a user will first place the disk drive in a mounting bracket and attach the three cables to the disk drive. Then, insertion of the disk drive unit into the enclosure will cause the adapter to mate with the backplane attached to the enclosure. Signals will be sent to the disk drive at different times depending on the length of the contact fingers on the adapter. In accordance with the present invention, long and medium length fingers are used for the paths that will apply power to the disk drive. This ensures that power will first be applied to fully enable the disk drive unit before any data is sent. The power applied to the disk drive unit will itself be gradual as determined by the time constant for a simple charging circuit that gets activated by the contact fingers. The medium length fingers cause full power to be applied to the disk drive. Eventually, the shorter length fingers will also make electrical contact which allows for the transfer of data to a fully powered disk drive unit.

One of the ribbon cables, employed as part of the adapter, is electrically connected to the ID configuration on the backplane. This cable, as well as the power and data cables, fit into corresponding connectors on a disk drive unit. When inserting a new disk drive unit, the user merely attaches this ID cable to the disk drive instead of manually setting the ID configuration.

It is these, as well as other, features employed by the present invention that make this SCSI disk array subsystem superior to any other system used previously.

These and other objects and features of the present invention will become more fully apparent from the following description and dependent claims taken in conjunction with the accompanying drawings.

BRIEF DESCRIPTION OF THE DRAWINGS

FIG. 3 is a top view of an adapter PCBA depicting the electrical contact strips and the connectors for attachment to the disk drive.

FIG. 4 is a close up view of the adapter PCBA showing the variable length electrical contact strips or fingers.

FIGS. 9a and 9b are schematic diagrams of a second SCSI bus found on the backplane of FIG. 7.

DETAILED DESCRIPTION OF THE PREFERRED EMBODIMENT

Reference is now made to the drawings wherein like numerals refer to like parts throughout.

Figure 1:
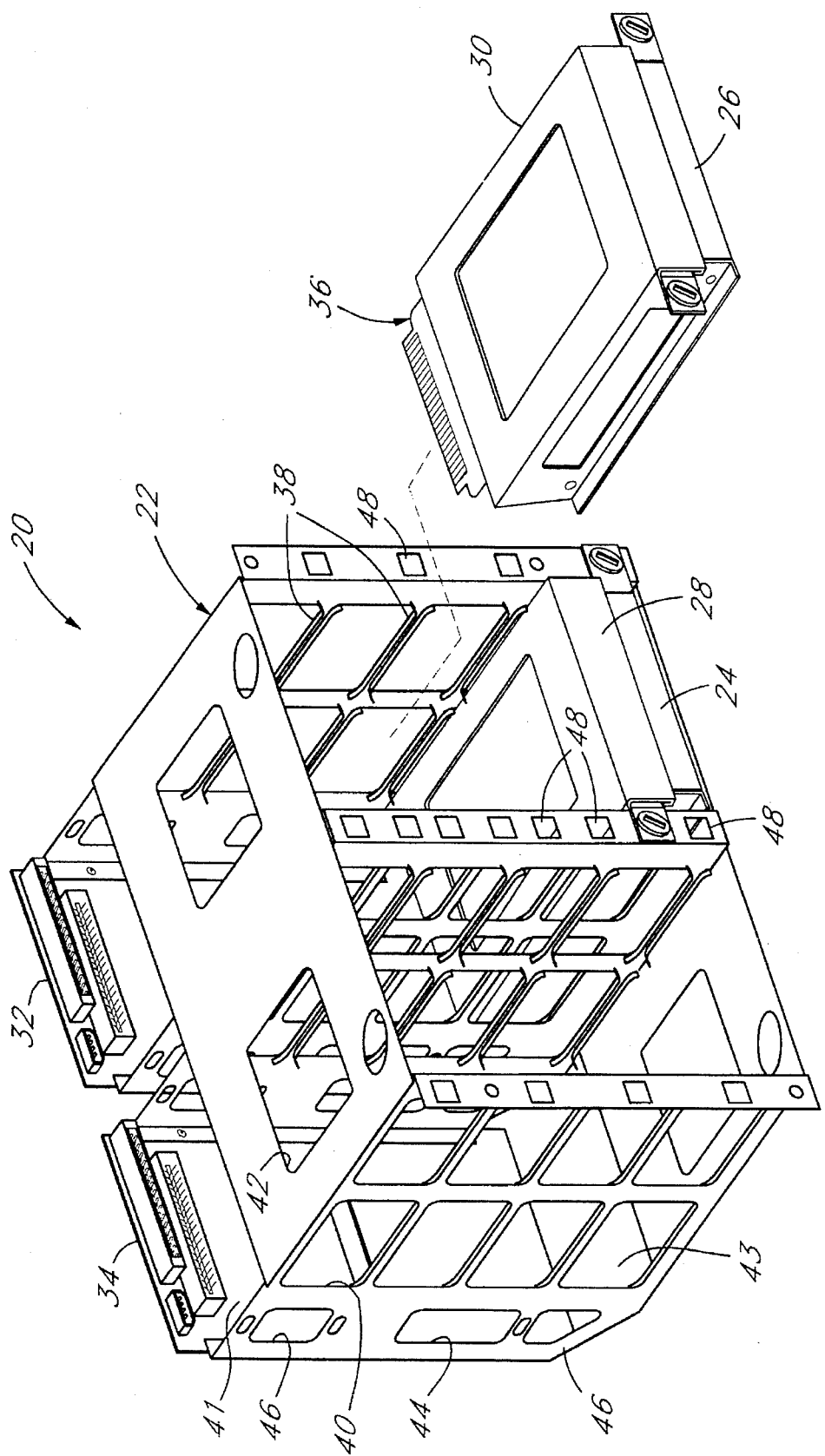
FIG. 1 is a perspective view of a SCSI Disk Array Subsystem in accordance with the present invention.

FIG. 1 illustrates an overall view of a small computer system interface (SCSI) disk array subsystem 20 in accordance with the present invention. The disk array subsystem 20 is shown having a mounting enclosure 22 that is designed to accommodate a plurality of disk drives. The particular subsystem 20 of FIG. 1 is shown having two disk drives 24 and 26. Attached to the disk drives are respective disk drive mounting brackets 28 and 30. The disk drive 24 and the mounting bracket 28 are shown in their fully inserted position as they would appear during operation. The disk drive 26 and the mounting bracket 30, however, are shown in a position just prior to insertion into the enclosure.

Also attached to the enclosure 22 is a pair of backplanes 32 and 34 which contain connectors and component circuitry for transfer of signal data and application of power to the disk drive units. Although two backplanes are shown in FIG. 1, the subsystem may operate with only one backplane. FIG. 1 depicts an adapter 36 attached to the mounting bracket 30 and electrically connected to the disk drive unit 26. Upon insertion of the disk drive unit 26, the adapter 36 will electrically connect the disk drive unit to the backplane 32.

The enclosure 22 is designed so that a number of disk drive units may be stacked vertically when the enclosure 22 is oriented as shown in FIG. 1. Other stacking orientations are also possible. For example, the enclosure 22 can be mounted with an orientation 90° to the orientation shown such the disk drive units are horizontally stacked.

Mounting bracket guides 38 are formed as part of the enclosure 22 and provide a low cost and efficient method of inserting and removing the disk drive units. In addition, various access cutouts 40, 42 and 44 have been made to the enclosure to facilitate service and maintenance of the subassembly. Improved cable and connection access is also provided with this enclosure by cutouts 41 and 43, and by having a tapered rear lower corner 46. The particular enclosure 22 depicted in FIG. 1 is designed to accommodate two sets of four 3-½" disk drives. Each set is connected to a separate backplane mounted on the rear of the enclosure. Disk drive units inserted into the enclosure, or more specifically disk drive mounting brackets, are held in place by attachment to openings 48. However, in accordance with the present invention, it is not necessary that every disk drive slot be occupied by a corresponding disk. In fact, the disk drive subassembly will operate either entirely full with eight disk drives or will operate with only one disk drive attached.

A separate disk drive enclosure and associated backplanes would be used to accommodate various disk drives such as those that are 5-¼" in size (not shown). Additionally, it may be appreciated that in accordance with the present invention, the enclosure 22 depicted in FIG. 1 could be manufactured of any size to accommodate only one set of disk drives or more than two sets. Also, the number of disk drive units in a set could be varied, depending on a user's particular need.

Figure 2:
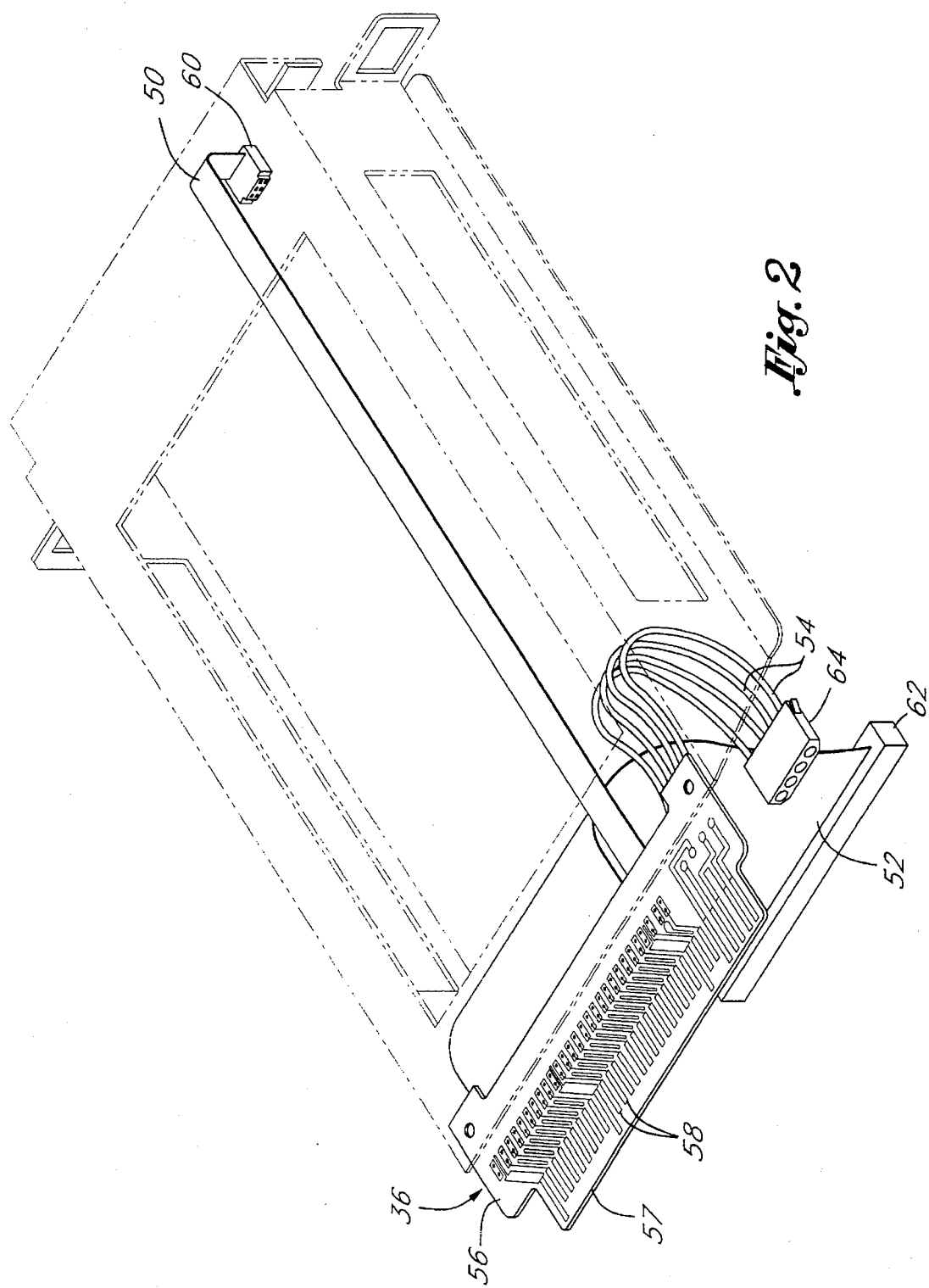
FIG. 2 is a perspective view of an adapter printed circuit board assembly (PCBA), shown conceptually with a disk drive mounting bracket.

The adapter 36 of FIG. 1 is more clearly shown in the perspective view of FIG. 2 where it is placed conceptually with a disk drive mounting bracket (shown in phantom). In accordance with the present invention, the adapter 36 mounts to the rear of the disk drive mounting bracket. However, it is conceivable that such an adapter could be easily formed as part of a disk drive unit. This would avoid the need for any mechanical attachment of the adapter to the disk drive mounting bracket. Although disk drives may come in varying sizes, the adapter 36 of the present invention can be universally applied to both 3-½" and 5- ¼" disk drives.

The adapter 36 has a ribbon cable assembly which provides a cable segment 50 for control of the SCSI ID to the disk drive. There is also a 50-pin SCSI cable segment 52 for attachment to the SCSI disk drive that connects the data bus and the control lines. The segments 50 and 52 terminate in connectors 60 and 62, respectively, which are attached to a disk drive (not shown) during operation. A power cable 54 is also part of the adapter and will be electrically connected to a disk drive unit via a power connector 64. The power connector 64 and cable-segment connectors 60 and 62 are designed to allow for physical misalignment of power and signal connectors that may occur between different disk drive manufacturers.

The adapter 36 is formed with a coplanar Printed Circuit Board Assembly (PCBA) 56. The PCBA 56 has a card edge 57 along which card edge fingers 58 are placed. There are 32 card edge fingers running along each side of the card edge 57. Upon insertion of a disk drive unit, the PCBA 56 will mate with a 64-pin card edge connector mounted on the backplane. The PCBA 56 has a controlled impedance for matching to cable 52 impedance. The configuration of the PCBA 56 and the card edge fingers 58 can best be understood in conjunction with FIGS. 3–5.

FIG. 3 shows a top level view of the adapter 36 comprising the printed circuit board assembly 56, the card edge fingers 58, and the cable assemblies 50, 52 and 54, which are attached to connectors 60, 62 and 64, respectively. Also shown in FIG. 3 are mounting holes 71 and 73 used to attach the adapter to the disk drive mounting bracket.

In accordance with the present invention, the fingers 58 are manufactured in three different lengths (long, medium or short). The fingers seen from a top view of the adapter 36, as shown in FIG. 3, correspond to the odd numbered contacts of a 64-pin card edge connector mounted on the backplane (not shown). The fingers found on this side of the PCBA are only of two lengths—long or short—and consequently no medium length fingers are depicted in FIG. 3. As can be readily seen, the fingers 1, 3, 5, 7, 9, 45 and 63 are long, while the remaining fingers are short.

Upon insertion of the adapter, the long fingers will make electrical contact first. According to the present invention, the long fingers are connected to either ground or to power precharge signals to ensure that the disk drive receives power before receiving any of the control or data lines. The short fingers shown in FIG. 3 correspond to either disk drive data lines, or disk drive control and status lines. A more detailed analysis of the printed circuit board assembly can be best described in accordance with a close-up view of the portion of the PCBA 56 defined by circle 4 of FIG. 3. This area is shown enlarged in FIG. 4.

FIG. 4 discloses a series of electrical contact fingers of which the finger 45 is long and the rest are short. The difference in length between the long and short fingers is approximately 130 mils, i.e., 130 thousandths of an inch. As can be seen from FIG. 4, the finger 45 is connected through a path 66 that leads to ground, while the rest of the fingers, except for the fingers transferring power, are connected through paths depicted generally as 68 and through various contacts 70. Each of the contacts 70 in turn leads to one of the cables 50, 52 or 54 (shown in FIG. 3). The flat ribbon cable impedance used to connect from a SCSI controller to the SCSI disk array is typically 110 ohms. To match this impedance on the printed circuit board design, grounded metal strips 72 are placed between paths 68 to ensure an impedance of 110 ohms is seen looking from the connector mounted on the backplane.

Referring again to FIG. 3, the long fingers of the PCBA 56, which connect first upon insertion, make contact with either ground or power precharge signals on the backplane. Specifically, finger 1 will attach to a precharge signal for the 12-volt power supply, while finger 7 will attach to a precharge 5-volt signal. Fingers 3, 5, 9, 45, and 63 will attach to ground through various routes. By attaching the power precharge and ground signals first, a static discharge path is created that avoids damage to the disk drive or system. Attachment to the power precharge signals also helps protect other drives in the SCSI disk array subsystem by providing a relatively slow application of power to the disk drive unit. This avoids unwanted sags in the power signal which can occur during sudden application of a load and can cause either the system to see a power fault or cause other disk drives to shut down due to insufficient voltage. The precharge signal is essentially a power signal channeled through a resistor element on the backplane. The precharge circuit design and operation will be described more fully in conjunction with FIGS. 7–10.

Figure 5:
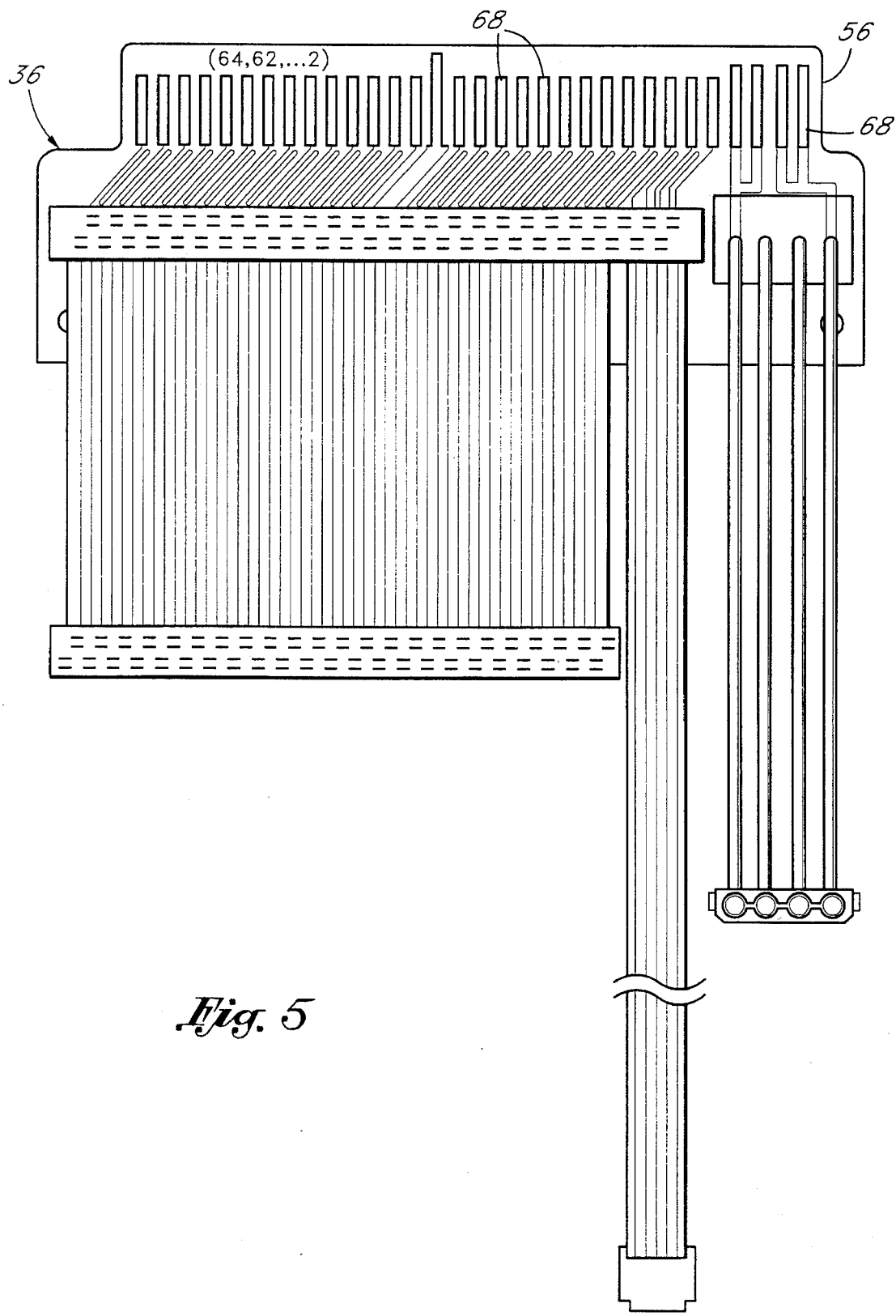
FIG. 5 is a bottom view of the adapter PCBA depicted in FIG. 3.

The bottom side of the adapter 36 is shown in FIG. 5. On this side of the PCBA 56 are a series of fingers 68, which are numbered evenly from 2 to 64. The contacts numbered "2," "4," "6" and "8" are of medium length, while the contact numbered "36" is long. The remaining even-numbered contacts are short. The difference in length between a long contact and a medium contact is approximately 60 mils, or nearly one-half the difference between the long contact and the short contact. The contact numbered "36" is connected to ground, and will thus mate before any of the other contacts on this side of the printed circuit board. As described above, this is to ensure that any static charge is dissipated before insertion of the disk drive data paths. The contacts numbered "2," "4," "6" and "8" are full-power contacts that are directly connected to either 5 or 12 volts, without any interposed resistive elements. These contacts mate to the connector just after mating of the precharge contacts shown in FIG. 3. Once power is applied via the medium length contacts numbered "2," "4," "6" and "8," the shorter length contacts on both sides of the printed circuit board make electrical contact and complete the connection of the SCSI bus signals from the controller to the disk drive.

Figure 6:
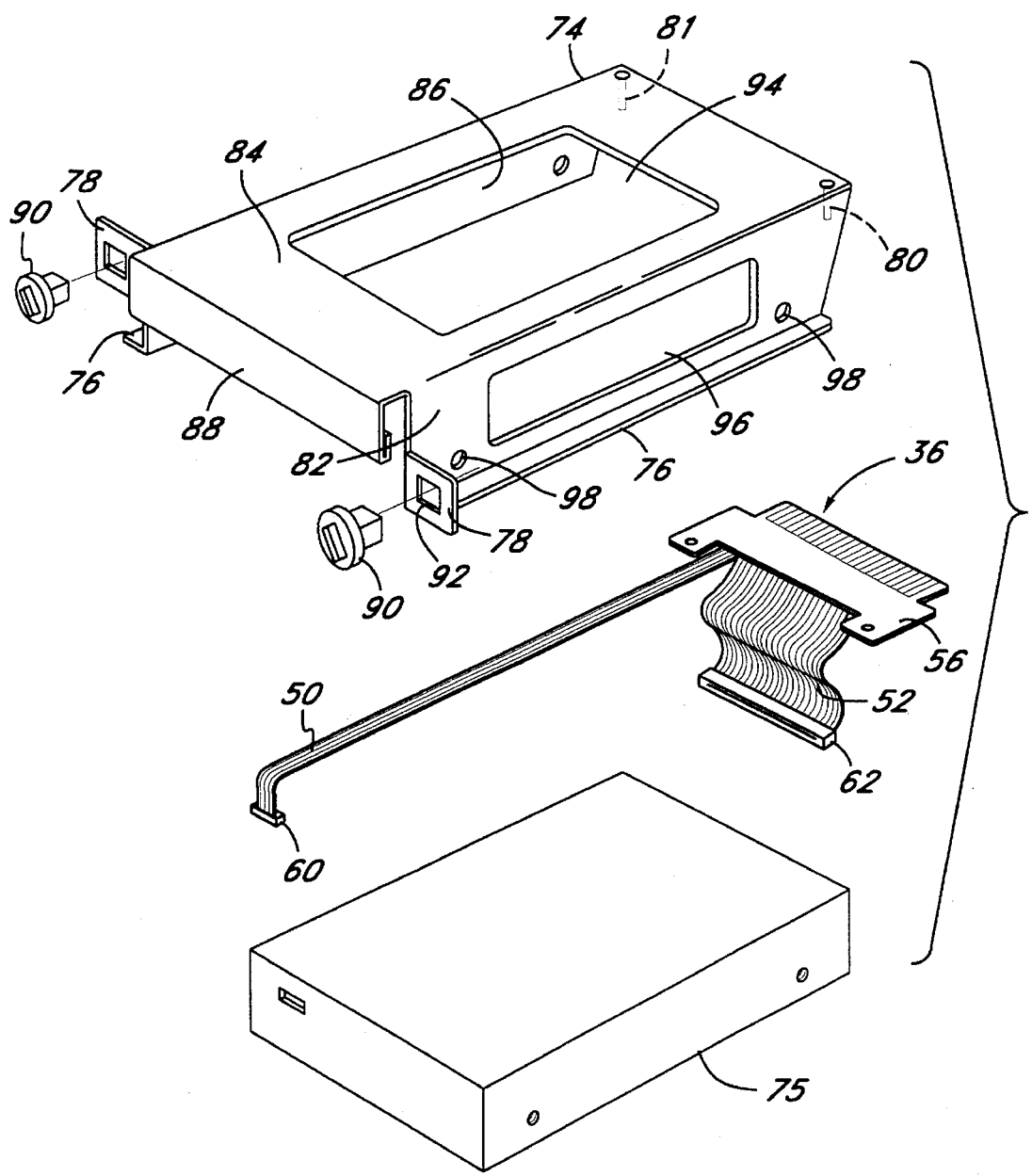
FIG. 6 is a perspective view of a disk drive mounting bracket, a corresponding adapter PCBA, and a corresponding disk drive.

The features of the disk drive mounting bracket can best be seen in conjunction with FIG. 6. Specifically, a disk drive mounting bracket 74 is shown having integrally formed flanges 76 and integral fastener holders 78. In accordance with the present invention, the adapter 36 is mounted to the rear of the bracket 74 by adapter mounting studs 80 and 81. A disk drive unit 75 is attached to bracket 74 at openings 98, and the entire assembly is held in place within the enclosure 22 (see FIG. 1) by a one-quarter turn fastener 90 which is passed through an integral fastener hole 92 and into a corresponding opening 48 in the enclosure 22 (see FIG. 1).

As depicted in FIG. 6, the mounting bracket 74 is shown having three main sides 82, 84 and 86, which are formed to partially cover three respective sides of the disk drive 75. The sides of the bracket 74 have openings 94 and 96 to facilitate both cooling of, and access to the disk drive unit. Once inserted into the mounting bracket 74, the disk drive's bottom side would be completely uncovered, while the remaining sides would only be partially covered. This also enhances cooling of the disk drive units from air forced over the disk drive surfaces, which might otherwise become hot and lead to incorrect data reception and transmission. The mounting bracket 74 also has an integrally formed handle 88 for allowing a user quick and simple access to an individual disk drive unit. Upon insertion of the disk drive, formed flanges 76 are designed to mate with the formed guides 38 of enclosure 22 (see FIG. 1). This allows for easy insertion and removal of the mounting bracket 74, and also ensures that the adapter 36 will be aligned with the connector on the backplane.

Once the assembly of a disk drive and disk drive mounting bracket 74 is completely inserted into the enclosure 22, the fastener 90 is then rotated one-quarter turn to secure the disk drive unit into the enclosure 22. To place the sets of disk drive units as close together as possible, the integral fasteners 90 are staggered so that they may be stacked on top of one another (i.e., as shown in FIG. 6, the right-hand fastening holder 78 is lower than the left-hand fastening holder 78 and, as shown in FIG. 1, the corresponding openings 48 in the enclosure 22 are staggered).

Figure 7:
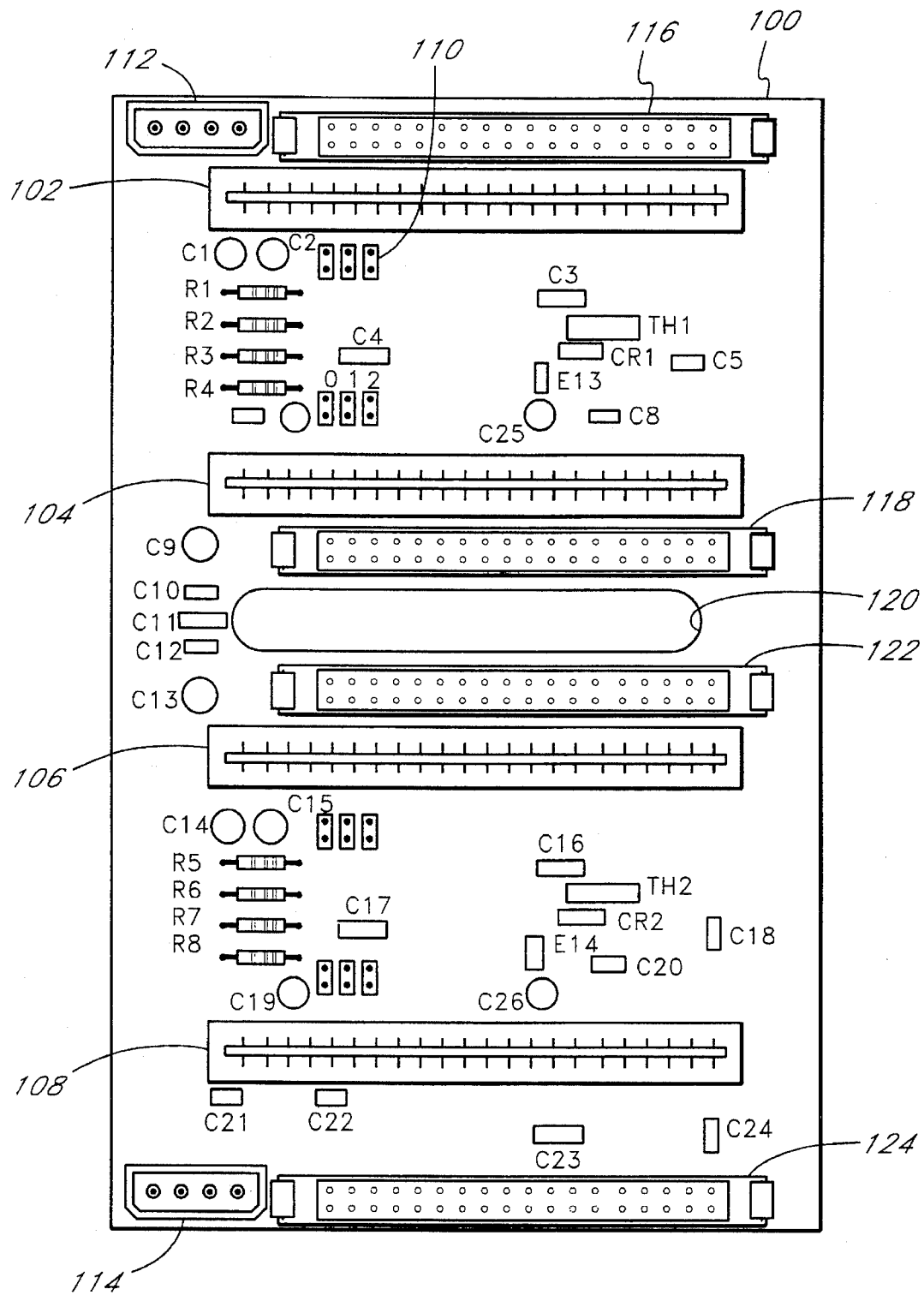
FIG. 7 is a component layout view of the backplane, having two independent SCSI buses, depicting connectors and circuit components.

A backplane printed circuit board assembly 100 used in the present invention is shown in FIG. 7. The backplane 100 comprises two similar buses, each having provisions for power and data signals. One of these buses includes card edge connectors 102 and 104, and the other bus includes card edge connectors 106 and 108. All four card edge connectors have a long wipe capability to allow for reception of longer length contacts to provide phased mating of signals in accordance with the present invention. The backplane 100 is designed to maintain an impedance to match the 110 ohm ribbon cable impedance normally used between SCSI disk drives and the SCSI disk controller.

Each card edge connector on the SCSI bus has a series of two resistors mounted on the backplane to control the rate at which power is applied through the card edge connector into the disk drive unit. These resistors are needed to control the voltage applied to the disk drive during insertion of a disk drive while the subassembly is "hot," i.e., while power is still being applied to the backplane and remaining disk drives. If a disk drive unit were to be initially plugged directly into a full power 5-volt or 12-volt signal, it would pull down the 5-volt or 12-volt signal for all of the remaining and operating disk drives, thus creating the possibility of temporarily powering down those other disk drives and causing the system to see a power failure.

The solution to this problem is to apply power initially to the disk drive through a resistor in order to precharge the drive electronics prior to applying full power. The resistor combines with the capacitance found in the disk drive to create a gradually increasing voltage dictated by the time constant for the resulting resistive and capacitive (RC) circuit. The power connected through the resistor will enter the disk drive through one of the longer fingers associated with the card edge adapter. The charge time will be relatively short but will create a gradual increase of voltage during the time the longer fingers make electrical contact and before the medium fingers, which transfer full power, make electrical contact. Thus, the capacitances in the drive electronics are charged in a controlled manner. Next, the shorter fingers make contact with the card edge connector to make connection to the SCSI bus. This phased mating of signals allows a disk drive unit, in accordance with the present invention, to be inserted while power is being applied to the disk array subsystem and while the other disk drive units are operating.

Another problem with hot-swapping disk drive units is ensuring that the disk drive unit being inserted has the same ID number as the one that was removed. The SCSI ID number for a given backplane connector is determined by the way three sets of pins are configured, or jumpered, on the backplane. For example, the card connector 102 has three sets of pins 110 assigned to it which determine the particular ID given to the disk drive that is plugged into it. Each set has two pins. The three sets of pins permit a binary ID number of 0 . . . 7 to be given. The replacement disk drive unit must be given the same ID number as the removed unit so that the controller will be able to uniquely access a particular disk drive unit and will be able to determine from which disk drive unit data is being sent.

Prior to the present invention, these ID numbers were manually set by three sets of pins on the disk drive unit so that they matched the ID designations on the SCSI bus. Typically, one of the pins for each pin set is attached to ground. The other pin will be selectably connected to the grounded pin, according to the particular ID desired. However, ID pin settings can vary between manufacturers of disk drive units, or even within the same manufacturer, which creates a further difficulty in trying to match ID designations. Accordingly, the present invention overcomes this problem by routing the ID designation, determined selectively by shorting the pins in each set of pins 110, through the card edge connector. Upon insertion of the adapter 36, the ID designations are transferred through the PCBA 56, the ribbon cable 50 and into the connector unit 60, which is then plugged directly into the disk drive unit. Thus, this scheme does not care which ID pins are grounded on the disk drive. By correctly applying connector unit 60 to the disk drive, the assignment of the least significant ID bits on the disk drive can also be ignored. This ensures that the new disk drive unit will always have the same ID designation as the disk drive removed from the disk array enclosure 22.

Also shown in FIG. 7 are connectors 112 and 114 for receiving incoming DC power to backplane 100. Each of the connectors 112 and 114 is electrically connected to both of the buses within backplane 100, therefore, only one of the power connectors need be used during operation. However, if the system is configured in a manner requiring more power than one connector can provide, the other power connector can also be used to accommodate the increased power level. Connectors 116 and 118 are also shown in FIG. 7. The connectors 116 and 118 are SCSI 50-pin connectors that are electrically connected to both the 64-pin card edge connectors 102 and 104. The connectors 116 and 118 may be attached to either a cable from a SCSI controller unit, or a cable to another backplane assembly, or to a termination plug assembly, depending on the configuration of the disk array subassembly.

For example, if one SCSI controller (not shown) is feeding the disk drive units attached to the connectors 102 and 104, then only one of the SCSI connectors, for example 116, will be connected to the controller. Because the connectors 102 and 104 are part of a single bus, any data sent on this bus could be transferred to either one of the disk drives, depending on the ID configuration selected by the controller. In this configuration, however, the additional SCSI connector, 118, must be terminated with an impedance matching plug, the SCSI terminator plug (not shown). An identical configuration could be used for setting up the bus associated with the card edge connectors 106 and 108, and a pair of SCSI connectors 122 and 124. In this manner, two separate pairs of disk drive units will be controlled by separate SCSI control lines. Because all components of the backplane 100 are accessible from one side, an opening or cutout 120 is made in the center of the backplane to facilitate any necessary cable connections and to allow the cables to be routed behind the backplane, i.e., on the opposite side, by passing the cables through the opening 120.

Alternatively, the backplane 100 may be configured so that connectors 102, 104, 106, 108, 116, 118, 122 and 124 are all part of a single data bus controlled by one SCSI control line. To set up the backplane in this configuration, a jumper cable must be used between the connectors 118 and 122, to provide a daisy chain connection between the two independent SCSI buses on backplane 100. Then, an impedance-matching terminator plug must be placed on either the connector 124 or the connector 116, depending on where the SCSI controller cable was attached.

Figure 8A:
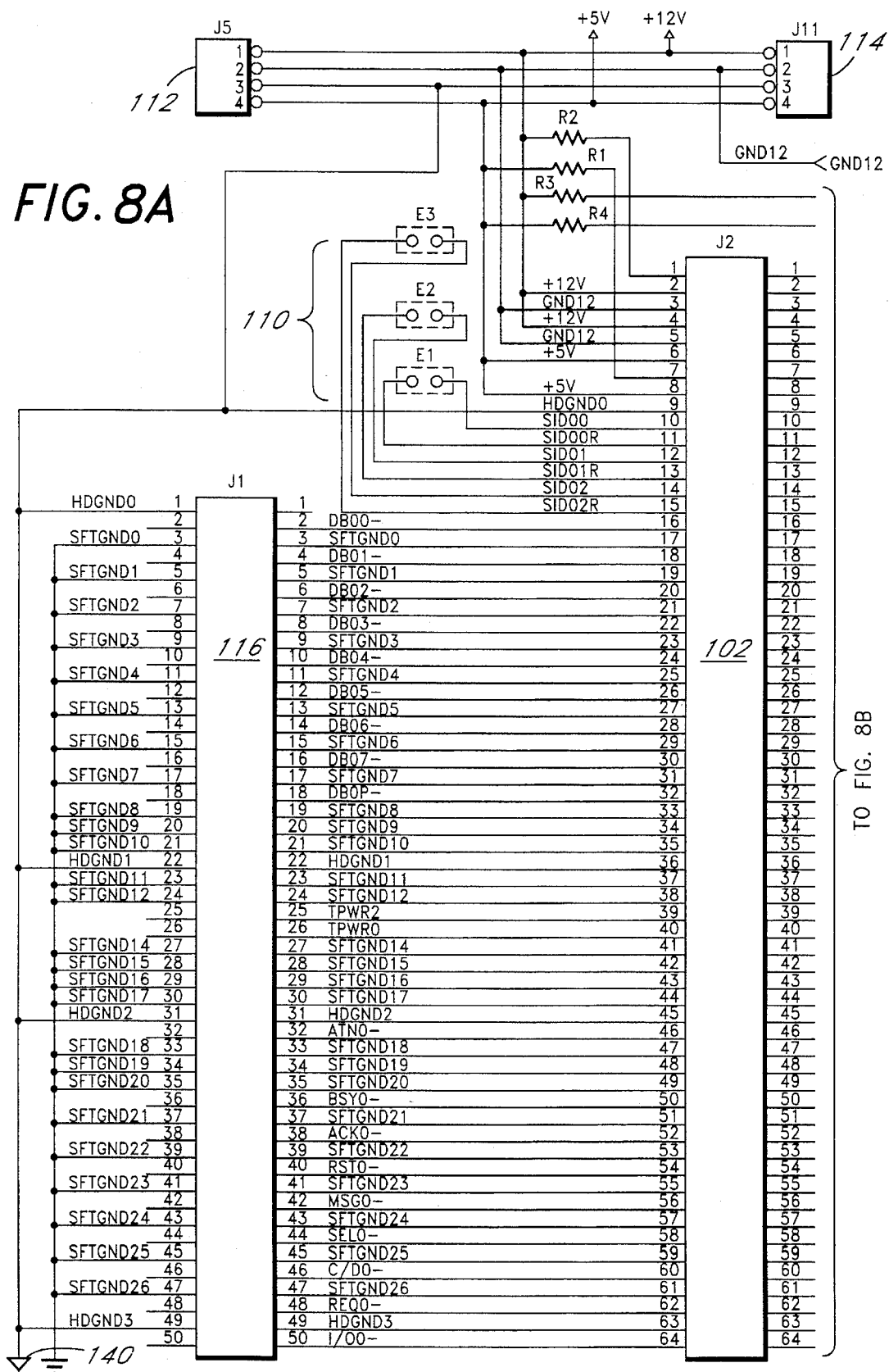
FIGS. 8a and 8b are schematic diagrams of a first SCSI bus found on the backplane of FIG. 7.
Figure 8B:
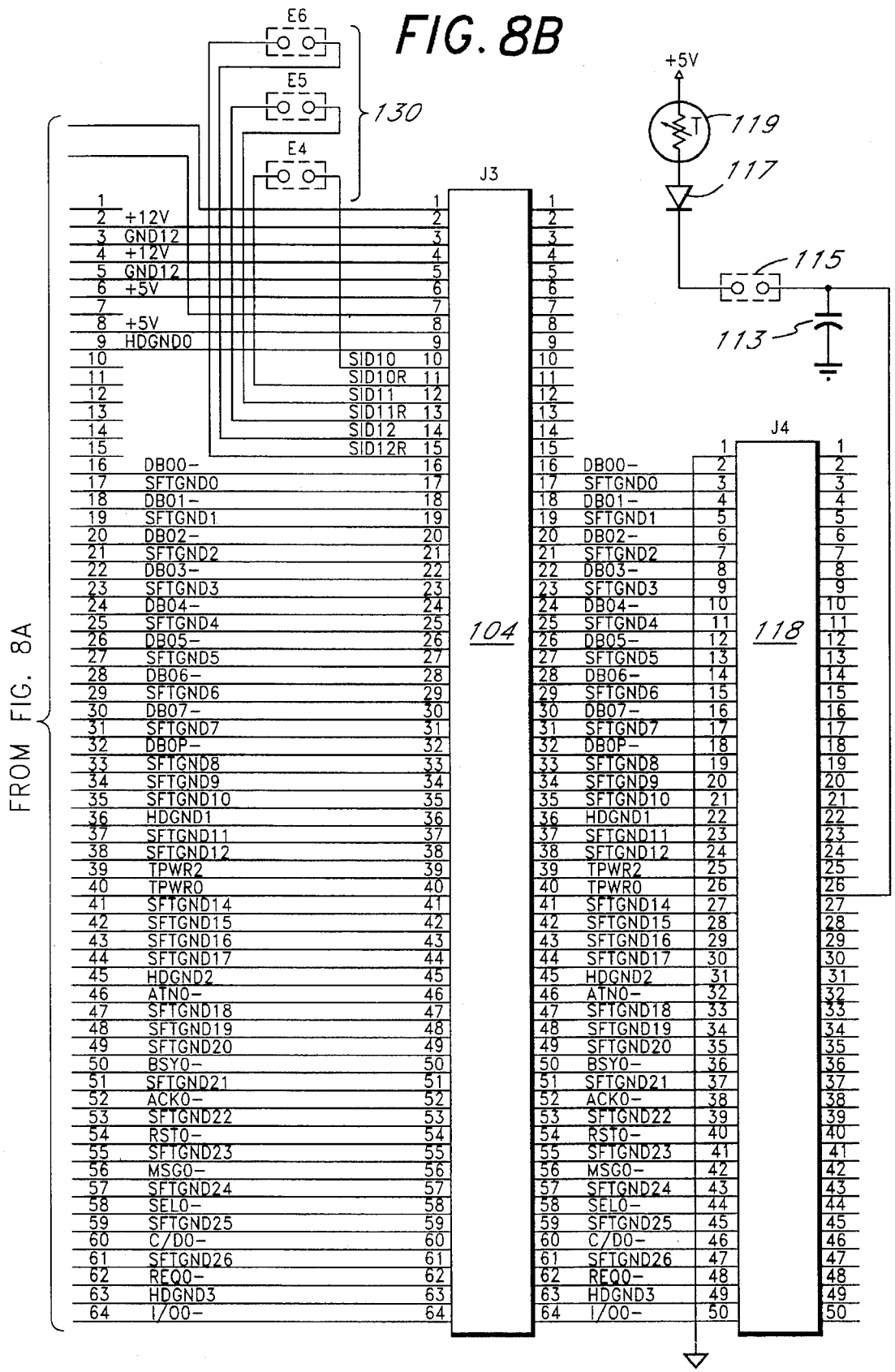
Figure 9A:
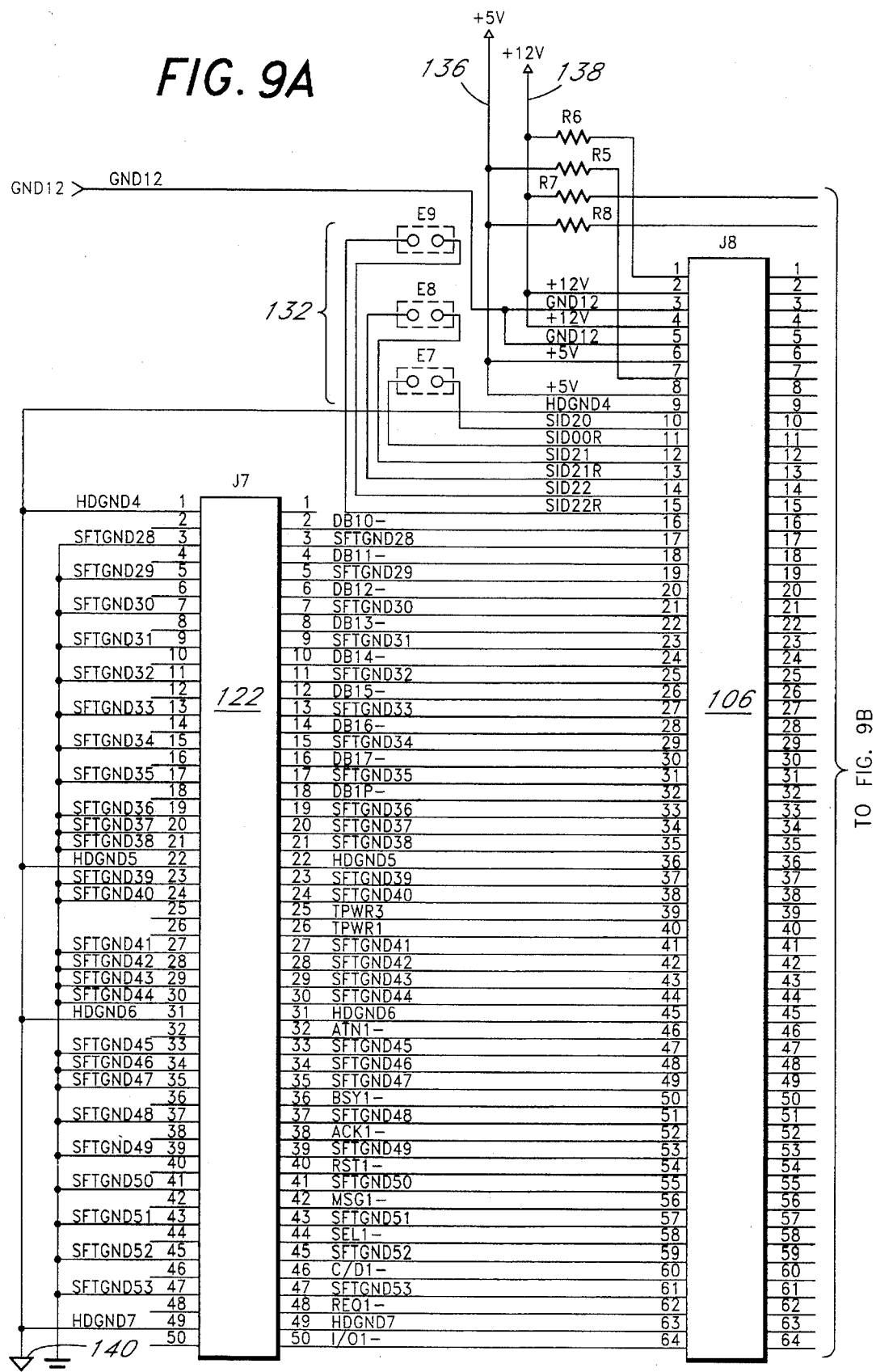
Figure 10:
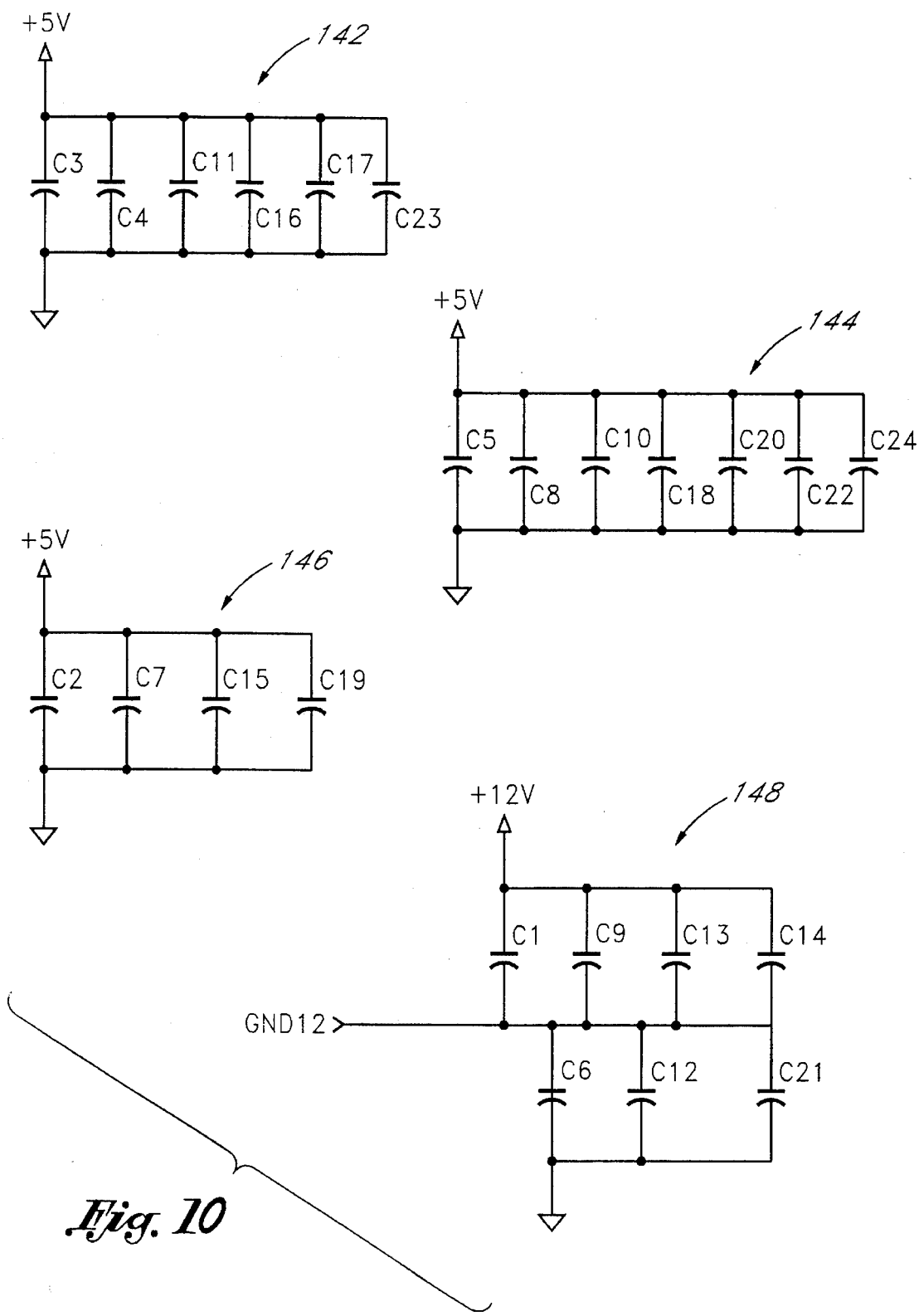
FIG. 10 is a schematic diagram of the capacitor banks found of the backplane of FIG. 7.

FIGS. 8–10 schematically depict the components and signal paths on the backplane. The connectors 102, 104, 116 and 118 are shown in FIGS. 8A and 8B, and are essentially a pass-through data bus for the 50-pin SCSI cable connector coming from the controller (not shown). The connectors 102 and 104 have fifteen (15) additional signal lines to accommodate signals from the ID settings 110 and 130, and to accommodate the signals from the power connectors 112 and 114.

As shown in FIGS. 8A and 8B, the 5-volt and 12-volt power signals are channeled through resistors R1 and R4, and through resistors R2 and R3, respectively. Specifically, the 5-volt line is channeled through the resistor R1 to the connector 102 and through the resistor R4 to the connector 104. Likewise the 12-volt signal is channeled through the resistor R2 to the connector 102 and through the resistor R3 to the connector 104. Although any component may be used which performs the necessary function of gradually applying power, the present invention simply uses a 4.7 ohm resistor for each of the resistors R1 and R4, and a 10 ohm resistor for each of the resistors R2 and R3. As can be seen in FIGS. 8A and 8B, the signal paths to the pins numbered "2," "4," "6" and "8" of the connectors 102 and 104, which correspond to medium length fingers on the PCBA 56, apply full power to the disk drive unit while signal paths to the pins numbered "1" and "7" of the connectors 102 and 104, which correspond to the long fingers of the PCBA 56, apply power precharge to the disk drive unit via the resistors R2 and R1, respectively.

Because the +5 v current available to a SCSI controller in an EISA I/O bus system is limited, there is insufficient current for the SCSI terminators when multiple SCSI channels are available from the same SCSI I/O controller. To overcome this problem, each independent SCSI bus of the backplane 100 contains a "Termpower" circuit for providing additional current to the SCSI bus terminators through their respective data paths. Specifically, FIG. 8B depicts a circuit having a capacitor 113, a jumper terminal set 115, a diode 117 and a thermistor 119. This Termpower circuit is connected to the SCSI bus at line 26, as shown in FIG. 8B, and becomes operational when a shorting plug (not shown) is attached to the jumper terminal set 115.

Figure 11:
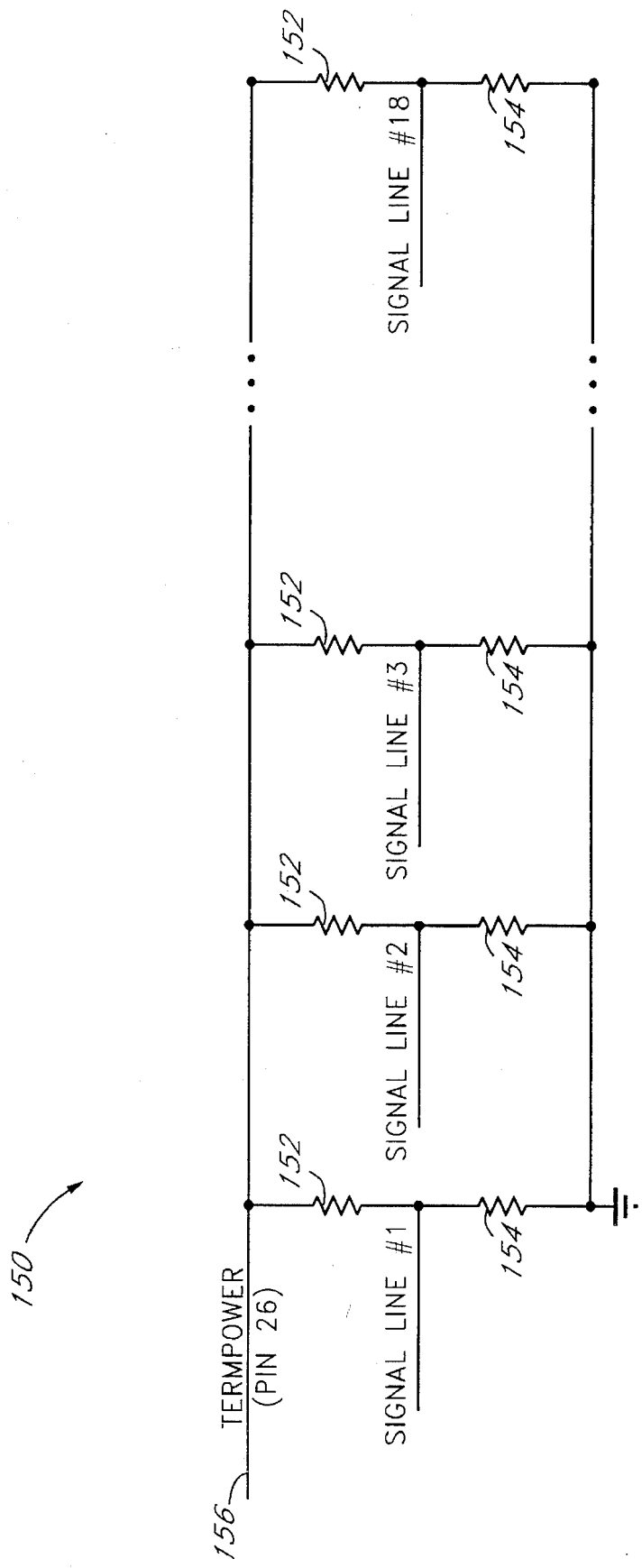
FIG. 11 is a schematic representation of a SCSI bus termination plug.

Operation of the Termpower circuit can best be described in conjunction with FIG. 11 which depicts a schematic representation of a typical passive SCSI termination connector. The termination connector circuit 150 of FIG. 11 has eighteen (18) sets of resistors connected in parallel. Each parallel path corresponds to a signal line and consists of two resistors 152 and 154 connected in series between a termpower bus line 156 and ground. The signal lines are connected to a respective parallel path as shown through termination resistors 154 to ground.

Having the Termpower circuit placed on the backplane is advantageous because the operator of a SCSI disk array subsystem no longer has to manually connect or jumper a Termpower circuit to a disk drive. In previous systems when this connection was inadvertently forgotten, data corruption would result.

Referring again to FIG. 8B, current for the SCSI termination plug flows through the thermistor 119, the diode 117 and through the signal lines of the SCSI bus. The diode 117 and thermistor 119 combination will limit the amount of current flowing to the backplane in the event of a fault or if a cable is mistakenly connected in reverse to a connector 116 or 118. In this manner, thermistor 119 acts as a fuse by having its resistance increase rapidly with temperature.

FIGS. 9a and 9b show an identical backplane configuration for the connectors 106, 108, 122 and 124 as that shown in FIG. 8. Power is applied through paths 136 and 138 and is fed to the connectors 106 and 108 either directly, or through one of the resistors R5–R8. A second Termpower circuit, identical to that of FIG. 8, is shown having a capacitor 113', a jumper terminal set 115', a diode 117' and a thermistor 119'. Accordingly, each independent bus of backplane 100 contains a Termpower circuit for providing additional current and for guarding against reverse connection of a SCSI cable. Also like FIG. 8, each connector 106 and 108 has signal paths for corresponding ID pins 132 and 134.

FIG. 10 shows the configuration of the capacitor banks mounted on the backplane 100. Common to the art of electronics, capacitor banks 142, 144 and 146 are used to smooth out the 5-volt power signal being applied to the backplane 100. Similarly, a capacitor bank 148 is used to smooth out the 12-volt power signal found on the backplane 100. As can be seen, the capacitor banks 142, 144, 146 and 148 are connected in parallel between a respective power signal and a node 140 of FIGS. 8 and 9 which is connected to main ground.

Capacitors C6, C12 and C21 of the capacitor bank 148 are connected between the 12-volt ground and the 5-volt ground, and are used to reduce electromagnetic interference (EMI) produced by the SCSI backplane 32.

Through the foregoing description and accompanying drawings, the present invention has been shown to have important advantages over the current SCSI disk array subsystems and the corresponding methods for replacing a failed disk drive. Specifically, the present invention allows "hot-swapping" of disk drive units without the fear of creating a system Power Fail condition or causing other drives in the system to shut themselves off due to insufficient voltage.

While the above detailed description has shown, described and pointed out the fundamental novel features of the invention as applied to various embodiments, it will be understood that various substitutions and changes in the form and details of the disk storage device and replacement method illustrated may be made by those skilled in the art, without departing from the spirit of the invention.

What is claimed is:

1. A computer data storage subsystem for accommodating a plurality of SCSI disk drive storage units whereby individual SCSI disk drive storage units may be removed and inserted during operation of said computer data storage subsystem, said computer data storage subsystem comprising:

at least one SCSI disk drive storage unit having an interface which carries SCSI signals to and from said SCSI disk drive, said interface comprised of a first SCSI multipin connector;

a frame for holding said disk drive unit;

a circuit board attached to said frame, said circuit board having signal lines which carry power and SCSI signal data from said computer said power and SCSI signal data to said disk drive storage unit said signal lines coupled to card edge receptacles; and an adapter having a set of contacts connected to a second SCSI connector and, said second SCSI connector adapted for connection to said first SCSI connector of said disk drive storage unit for electrically connecting said disk drive storage unit to said adapter, said adapter having a card edge with electrical contacts corresponding to said set of contacts of said second SCSI connector, said card edge adapted for insertion into said card edge receptacles, wherein said electrical contacts are of different lengths to allow for insertion of said disk drive storage unit into said frame and for making electrical contact with said circuit board while said computer data storage system is operating.

2. The computer data storage subsystem as defined in claim 1, wherein said electrical contacts include long contacts, short contacts and medium-length contacts, said long contacts making electrical connection first with said circuit board, said medium-length contacts making electrical contact second with said circuit board, and said short contacts making electrical contact last with said circuit board.

3. The computer data storage subsystem as defined in claim 2, wherein said long contacts are approximately 130 mils (thousandths of an inch) longer than said short contacts, and said long contacts are approximately 65 mils longer than said medium-length contacts.

4. The computer data storage subsystem as defined in claim 1, wherein said electrical contacts include long contacts electrically connected to ground and long contacts electrically connected to a precharge signal on the circuit board when one of said disk drive storage units is inserted into said frame, said long contacts making electrical contact with said circuit board before other contacts having shorter lengths.

5. The computer data storage subsystem as defined in claim 4, wherein said long contacts provide power precharge to said disk drive unit.

6. The computer data storage subsystem as defined in claim 4, wherein said electrical contacts include medium-length contacts for connection of power signals from said circuit board to one of said disk drive storage units upon insertion of said disk drive storage unit into said frame, said medium-length contacts making electrical contact with said circuit board after said long contacts and before other contacts having shorter lengths.

7. The computer data storage subsystem as defined in claim 6, wherein said medium-length contacts provide full power to said disk drive unit.

8. The computer data storage subsystem as defined in claim 6, wherein said electrical contacts include short length contacts for connection of data paths from said circuit board to one of said disk drive storage units, said short length contacts making electrical contact with said circuit board after said long contacts and said medium-length contacts.

9. The computer data storage subsystem as defined in claim 8, wherein said short length contacts provide data and control signals to said disk drive unit.

10. The computer data storage subsystem as defined in claim 1, wherein said adapter includes a coplanar printed circuit board assembly to provide a matching impedance with a card edge connector mounted on said circuit board.

11. The computer data storage subsystem as defined in claim 1, wherein said adapter is integrally formed with said disk drive storage unit.

12. The computer data storage subsystem as defined in claim 1, further comprising a mounting bracket attached to said disk drive storage unit, said mounting bracket having integrally formed flanges for insertion into said frame.

13. The computer data storage subsystem as defined in claim 12, wherein said mounting bracket is formed with fastening holders for attaching said mounting bracket to said frame, said fastening holders being staggered to allow for nesting of said mounting brackets.

14. The computer data storage subsystem as defined in claim 12, wherein said adapter is mechanically attached to said mounting bracket.

15. The computer data storage subsystem as defined in claim 1, wherein said frame has integrally formed guides for accepting a disk drive storage unit.

16. The computer data storage subsystem as defined in claim 1, wherein said backplane has an opening formed therein to allow cables electrically connected to said backplane to pass through said backplane.

17. A multi-disk drive unit subsystem for use with a computer system comprising:

at least two disk drive storage units, each of said disk drive storage units having a first multi-pin connector having signal pins to carry power signals for said disk drive storage unit and a second multi-pin connector having signal pins to carry data signals for said disk drive storage unit;

an enclosure for housing said disk drive storage units;

a backplane affixed to said enclosure said backplane having signal lines which carry power and data signals from said computer system, said backplane also having receptacle connectors coupled to said signal lines and configured to receive card edge connectors, said backplane providing interconnection for said at least two disk drive storage units; and at least two adapters, each adapter having a card edge connector adapted for insertion into one of said receptacle connectors and having signal traces electrically connected to a corresponding one of said disk drive storage units via said first and second multi-pin connectors, said card edge connectors of said adapters having staggered fingers to allow phased mating of said fingers to said backplane upon insertion of said disk drive storage units into said enclosure.

18. The disk drive subsystem as defined in claim 17, wherein said enclosure has guides for insertion and removal of said disk storage units.

19. The disk drive subsystem as defined in claim 17, further comprising a mounting bracket attached to one of said disk drive storage units wherein said mounting bracket has formed flanges for guiding said mounting bracket and said one of said disk drive storage units into and out of said enclosure.

20. The disk drive subsystem as defined in claim 19, wherein said mounting bracket has integrally formed fastening holders for attaching said mounting bracket to said enclosure, said fastening holders being staggered to allow for nesting of said mounting bracket with additional mounting brackets.

21. The disk drive subsystem as defined in claim 19, wherein said mounting bracket is formed with an underside opening to expose a portion of said disk drive storage unit and enhance cooling and access to said disk drive storage unit.

22. The disk drive subsystem as defined in claim 19, wherein said mounting bracket surrounds the top of and sides of said disk drive storage unit and said mounting bracket is formed to improve airflow for cooling of electronic components within said disk drive storage units and to allow for improved connector access.

23. The disk drive subsystem as defined in claim 19, wherein said mounting bracket is of unitary design with an integral handle to facilitate removal and insertion of said disk drive storage unit.

24. The disk drive subsystem as defined in claim 17, wherein each of said adapters has a two-sided printed circuit board, and wherein said fingers are placed along an edge of said printed circuit board.

25. The disk drive subsystem as defined in claim 17, wherein each of said adapters has a ribbon cable assembly for providing a data bus connection and an ID connection to a corresponding one of said disk drive storage units.

26. The disk drive subsystem as defined in claim 17, wherein each of said adapters has a power cable for attachment to said first multi-pin connector of a corresponding disk drive unit.

27. The disk drive subsystem as defined in claim 17, wherein said backplane has a plurality of card edge connectors each with a long-wipe capability for accepting said staggered fingers of said adapters and for providing data signals and power to said disk drive storage units.

28. The disk drive subsystem as defined in claim 17, wherein said backplane includes resistors for electrical connection to one of said adapters when a corresponding one of said disk drive storage units is inserted into said enclosure, said resistors communicating power to said disk drive unit via selected ones of said staggered fingers that make electrical contact before others of said staggered fingers to precharge said disk drive storage unit before applying full power to said disk drive storage unit.

29. The disk drive subsystem as defined in claim 17, wherein said backplane is formed with an opening to allow cables, electrically connected to said backplane, to pass through said opening.

30. A method of replacing a data storage device of an operating array of data storage devices connected to a computer system, without having to remove power from said array of data storage devices or said computer system, wherein said array of data storage devices are interconnected through backplane interconnecting lines, said data storage devices having a first multi-pin interface connector for transferring and receiving data signals to and from said common backplane, said method comprising the steps of:

removing a data storage device from said operating array of data storage devices;

providing a converter having a second multi-pin connector and having a card edge connector wherein said second multi-pin connector is in electrical communication with said card edge connector;

connecting said second multi-pin connector to a third multi-pin connector of a replacement data storage device;

positioning said replacement data storage device within said array of data storage devices;

engaging a first set of electrical contacts of said card edge connector with a first set of electrical contacts of said backplane to provide at least one ground connection and at least one power precharge connection between said backplane and said data storage device, said power precharge connection providing power to said data storage device through an impedance selected to charge any capacitances within said data storage device in a controlled manner;

engaging a second set of electrical contacts of said card edge connector with a second set of electrical contacts of said backplane to provide power directly to said data storage device; and engaging a third set of electrical contacts of said card edge connector with a third set of electrical contacts of said backplane to communicate data and control signals between said backplane and said data storage device, said card edge and said backplane formed so that said first set of electrical contacts engage before said second set of electrical contacts, and so that said second set of electrical contacts engage before said third set of electrical contacts.

* * * * *